(12) United States Patent
Anand et al.

(10) Patent No.: US 7,916,826 B2
(45) Date of Patent: *Mar. 29, 2011

(54) DIAGNOSTIC METHOD AND APPARATUS FOR NON-DESTRUCTIVELY OBSERVING LATCH DATA

(75) Inventors: Darren L. Anand, Essex Junction, VT (US); John R. Goss, South Burlington, VT (US); Peter O. Jakobsen, Lakewood, CO (US); Michael R. Ouellette, Westford, VT (US); Thomas O. Sopchak, Williston, VT (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 215 days.

This patent is subject to a terminal disclaimer.

(21) Appl. No.: 12/175,534

(22) Filed: Jul. 18, 2008

(65) Prior Publication Data

US 2009/0180584 A1    Jul. 16, 2009

Related U.S. Application Data

(63) Continuation of application No. 11/533,907, filed on Sep. 21, 2006, now Pat. No. 7,453,973.

(51) Int. Cl.
*G11C 19/00* (2006.01)
(52) U.S. Cl. .............................. 377/77; 377/68
(58) Field of Classification Search ............ None
See application file for complete search history.

(56) References Cited

U.S. PATENT DOCUMENTS

| 3,921,003 | A  | 11/1975 | Greene |
| 4,000,460 | A  | 12/1976 | Kadakia et al. |
| 4,980,889 | A  | 12/1990 | DeGuise et al. |
| 5,495,486 | A  | 2/1996  | Gheewala |
| 6,081,916 | A  | 6/2000  | Whetsel, Jr. |
| 6,223,313 | B1 | 4/2001  | How et al. |
| 6,292,868 | B1 | 9/2001  | Norman |
| 6,701,404 | B1 | 3/2004  | Hamre et al. |

*Primary Examiner* — Tuan Lam
(74) *Attorney, Agent, or Firm* — Gibb I.P. Law Firm, LLC; Richard M. Kotulak, Esq.

(57) ABSTRACT

The invention provides a circuit that can observe data within shift registers without altering the data. The circuit includes selectors connected to the inputs and outputs of the shift registers. The selectors selectively connect the input with the output of a selected shift register to form a wiring loop for the selected shift register. A control device connected to the wiring loop uses the wiring loop to cause the data to be continually transferred from the output of the selected shift register to the input of the selected shift register and back through the selected shift register in a circular manner. The control device includes a counter used for determining the length of a selected shift register and a set of registers to store, for future use when rotating data in the shift registers, the length of each shift register. The control device also includes a data output accessible from outside the circuit. An observation wire is connected to the wiring loop, and the data passes from the wiring loop to the control device through the observation wire. The control device outputs data appearing on the wiring loop as the data is circulated through the selected shift register to permit data within the selected shift register to be observed outside the circuit without altering the data within the selected shift register.

17 Claims, 3 Drawing Sheets

US 7,916,826 B2

DIAGNOSTIC METHOD AND APPARATUS FOR NON-DESTRUCTIVELY OBSERVING LATCH DATA

CROSS REFERENCE TO RELATED APPLICATIONS

This application is a continuation of U.S. application Ser. No. 11/533,907 filed Sep. 21, 2006, which is a continuation of U.S. application Ser. No. 10/604,550 filed Jul. 30, 2003, which is fully incorporated herein by reference.

BACKGROUND OF INVENTION

1. Field of the Invention

The present invention generally relates to latch circuits and more particularly to a circuit that examines the data within the latch circuit without altering or destroying the data.

2. Description of the Related Art

When bringing up and debugging logic state machines, it is of interest to be able to observe the state of latches for parts or all of the logic on the device without destroying the state of those latches. This is important both for initialization and for debug of follow-on manufacturing processes. It is also an advantage for the method of observation not to require prior knowledge of the latch constitution.

SUMMARY OF INVENTION

The invention provides a circuit that can observe data within shift registers without altering the data. The circuit includes selectors connected to the inputs and outputs of the shift registers. The selectors selectively connect the input with the output of a selected shift register to form a wiring loop for the selected shift register. A control device connected to the wiring loop uses the wiring loop to cause the data to be continually transferred from the output of the selected shift register to the input of the selected shift register and back through the selected shift register in a circular manner. The control device includes a data output accessible from outside the circuit. An observation wire is connected to the wiring loop, and the data passes from the wiring loop to the control device through the observation wire. The control device outputs data appearing on the wiring loop as the data is circulated through the selected shift register to permit data within the selected shift register to be observed outside the circuit without altering the data within the selected shift register.

The inventive control device has a shift register selector connected to the selectors that cause the selectors to form the wiring loop using one or more different shift registers from the selected shift register. The control device can optionally include a storage device for recording the data as the data appears on the wiring loop. The invention can also include a write device for changing one or more bits of data within the shift register before the data is returned to the input of the shift register.

The control device can maintain data on the different lengths of the different shift registers or the control device can include a shift register length determination unit that sends a unique data marker circularly through the shift register and counts the number of bits that pass through the wiring loop as the unique marker completes the circular loop through the shift register and returns to the wiring loop. A shift register length control unit limits the circular transfer of data within the wiring loop and the shift register such that all of the data is circulated through the wiring loop a single time and the data is returned to the same position within the shift register before and after the circular transfer of the data.

The invention uses the foregoing circuit to provide a method for observing data within a shift register without altering the data. The method selects a shift register from many shift registers and then continually transfers data from the output of the shift register to the input of the shift register and back through the shift register in a circular manner. The method outputs data as the data is transferred from the output of the shift register to the input of the shift register to permit data within the shift register to be observed outside the circuit without altering the data within the shift register. This allows the invention to send data to a location external to the shift register to allow the shift register to be examined by an external device.

The process of selecting the shift register comprises controlling selectors to form a circuit between the output of the shift register and the input of the shift register by connecting a wiring loop between the output of the shift register and the input of the shift register. This method can optionally store the data in a memory location separate from the shift register. As mentioned above, the invention provides the ability to alter the data between the time the data is received from the output of the shift register and the data is transferred to the input of the shift register.

The circular data transfer is performed for a single data transfer loop such that the data is at the same position within the shift register before and after the data transfer process. This method can determine the length of the shift register by sending a unique data marker circularly through the shift register and counting the number of bits that pass through the shift register as the unique marker completes the circular loop through the shift register before circularly transferring the data.

BRIEF DESCRIPTION OF DRAWINGS

The foregoing invention will be better understood from the following detailed description with reference to the drawings, in which.

DETAILED DESCRIPTION

As mentioned above, it is of interest to be able to observe the state of latches for parts or all of the logic on the device without destroying the state of those latches. It is also an advantage for this observation not to require prior knowledge of the length of the shift register. The invention described below provides a circuit and method for the circular shifting of varying length rotating shift registers and observation (or control) of each bit in the shift register during a circular shift process. The process ultimately restores the data back to the original positions in the latches of the shift register. In order to limit the need to have knowledge of any particular design, this invention also contains logic that can be used in a separate pre-operated mechanism to determine the length of each shift register that needs to be observed. This allows the method to work independently of any particular chip design.

Figure 1:
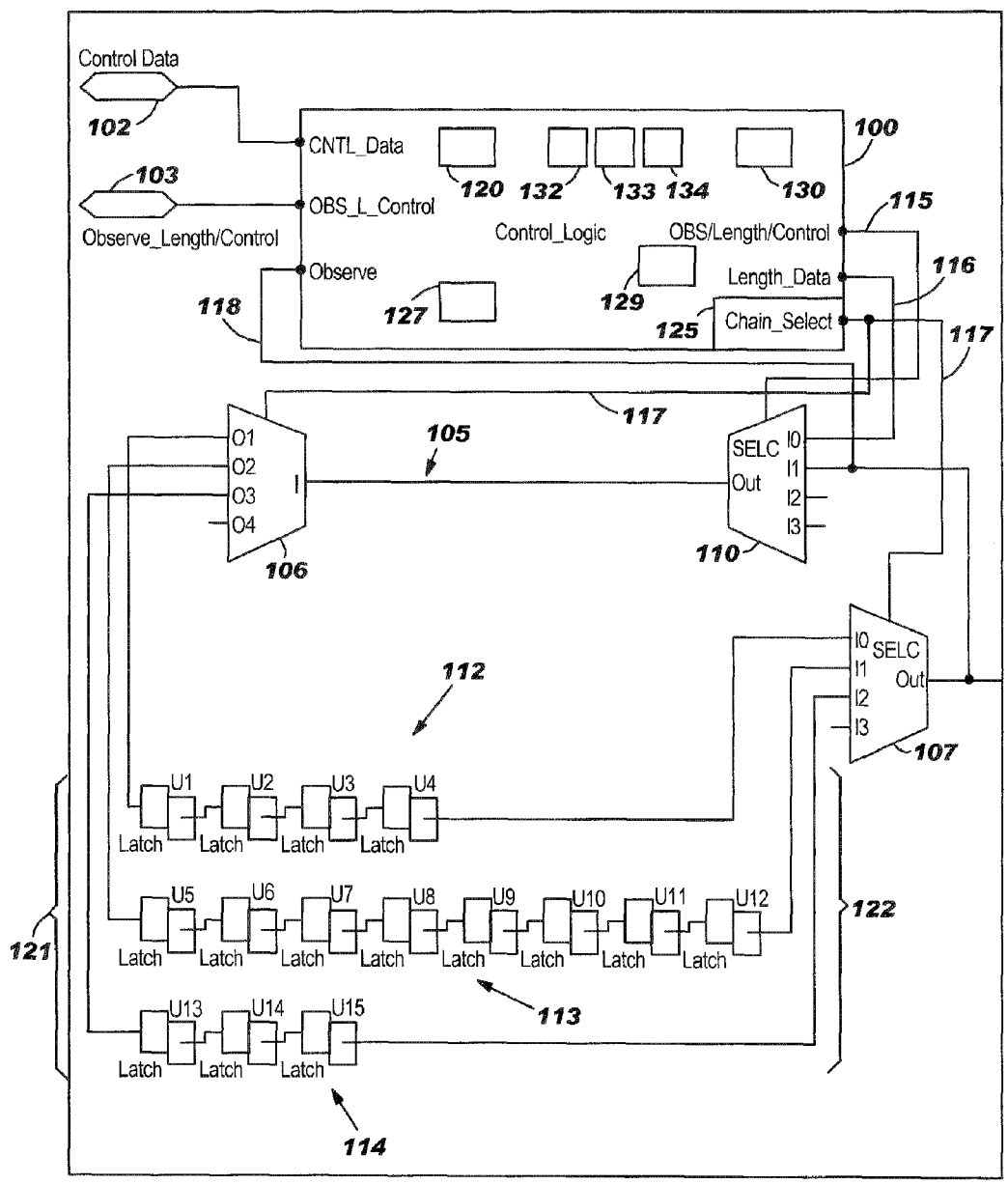
FIG. 1 is a schematic diagram of one embodiment of the inventive circuit.

As shown in FIG. 1, the invention provides a circuit that can observe data within shift registers without altering the data. The circuit includes selectors (e.g., demultiplexors/multiplexors) 106, 107 connected to the inputs 121 and outputs 122 of the shift registers 112-114. The selectors 106, 107 selectively connect the input with the output 122 of one of the shift registers 112-114 to form a wiring loop 105 for the selected shift register.

A control device 100 connected to the wiring loop 105 uses the wiring loop 105 to cause the data to be continually transferred from the output 122 of the selected shift register to the input 121 of the selected shift register and back through the selected shift register in a circular manner. The control device 100 includes a data input/output 103 that is accessible from outside the circuit. The data input/output 103 is also used to input the different lengths of the shift registers 112-114, if these lengths are known. Item 102 represents the external control input for the control device logic 100.

In an alternative embodiment, described below, the invention can determine the length of each shift register. At the beginning of the shift register length determination operation the selected shift register of interest 112, 113 or 114 is initialized to contain all logical "0"s. A logical "1" is then provided by the control device 100 as a length marker into the selected shift register 112, 113 or 114 along signal line 116 to a multiplexor 110. The signal 115 from the control device 100 is used to select the logical "1" to be loaded into the selected shift register during the shift register length determination operation. The control device 100 can observe (via signal path 118) the contents of the selected shift register 112, 113 or 114 as the shift operation is performed and a counter 130 within the control device 100 will count shift cycles until the logical "1" is observed. The counter 130 now contains the length of the selected shift register 112, 113 or 114 and this length can be stored in one of multiple length storage registers 132, 133 or 134 within the control device 100 for future use when rotating data in one of the selected shift registers 112, 113 or 114. Length storage register 132 will store the length of shift register 112, and length storage register 133 will store the length of shift register 113 and so on and so forth, each shift register length being stored into a dedicated length storage register 132-134 within the control device 100. Signal line 115 is connected to the multiplexor 110 and allows the control device 100 to determine when all the data within the shift registers 112-114 has been circularly transferred through the wiring loop 105 and back into the shift registers 112-114. Thus, the length storage registers 132-134 within the control device 100 limits the circular transfer of data within the wiring loop 105 and the selected shift registers 112-114 such that all of the data is circulated through the wiring loop 105 a single time and the data is at the same position within the selected shift register 112-114 before and after the circular transfer of the data.

Therefore, with the invention, after the data is circularly transferred through the wiring loop 105, it returns to its original position within each of the shift registers 112-114. Therefore, with the invention, the data within the shift registers 112-114 is left essentially undisturbed even after it has been fully observed. As described in an alternative embodiment discussed below, the invention can alter one or more of the bits of data within the shift registers 112-114 (as desired) as the data is being circularly transferred through the wiring loop 105.

An observation wire 118 is connected to the wiring loop 105, and the data passes from the wiring loop 105 to the control device 100 through the observation wire 118. The control device 100 outputs data appearing on the wiring loop 105 through the observation input/output port 103 as the data is circulated through the selected shift register and wiring loop 105 to permit data within the selected shift register to be observed outside the circuit without altering the data within the selected shift register.

The inventive control device 100 has a shift register selector portion 125 that is connected to the selectors 106, 107 through the selection line 117 that causes the selectors 106, 107 to form the wiring loop 105 using one of the shift registers 112-114. The control device 100 can optionally include a storage device 120 for recording the data as the data appears on the wiring loop 105. The data within the storage device can be observed through the input/output port 103. The internal connections, buses, etc., within the control device 100 are not illustrated so as not to obscure the salient features of the invention; however, such wiring connection would be well-known by those ordinarily skilled in the art.

The invention can also include a write device 127 for changing one or more bits of data within the shift register before the data is returned to the input 121 of the shift register. The write device 127 can output a new data bit along line 116 at the appropriate time to replace a pre-existing data bit within any individual latch (U1-U15) within the various shift registers 112-114. Therefore, the multiplexor 110 selects the data appearing along line 116 in place of the data flowing from the shift register output 122 to replace a bit of data being written back into the input 121 of the shift register. More specifically, the control device logic 100 can be set such that operation of the control data 102, and observe length control pin 115 would result in modification of the particular bit then being shifted to the circular path 105. This allows modification of internal data without disturbing other bits in the chain. The control logic can be controlled either via scanning, shifting, or by direct primary input (PI) control. Therefore, for example, if the shift registers 112-114 maintained fuse data information, such information can be selectively changed using the invention.

The control device 100 can maintain data on the different lengths of the different shift registers (as input through the input/output port 103) in the memory 120 or a separate memory. Alternatively, the control device 100 can include a shift register length determination unit 129 that sends a unique data marker circularly through the shift register and counts the number of bits that pass through the wiring loop 105 as the unique marker completes the circular loop through the shift register and returns to the wiring loop 105. Therefore, the invention can circulate a data bit comprising "1" along with a string of "0" data bits and count the number of bits that occur from the time the "1" data bit enters the input 121 of one of the shift registers 112-114 until the "1 returns back to the wiring loop 105 from the output 122 of the shift register. The invention preferably determines the lengths of the different shift registers 112-114 during an initialization process and records this information for later use. If desired, the invention can only determine the lengths of the shift registers that will be observed, or can determine the lengths of all shift registers.

Figure 2:
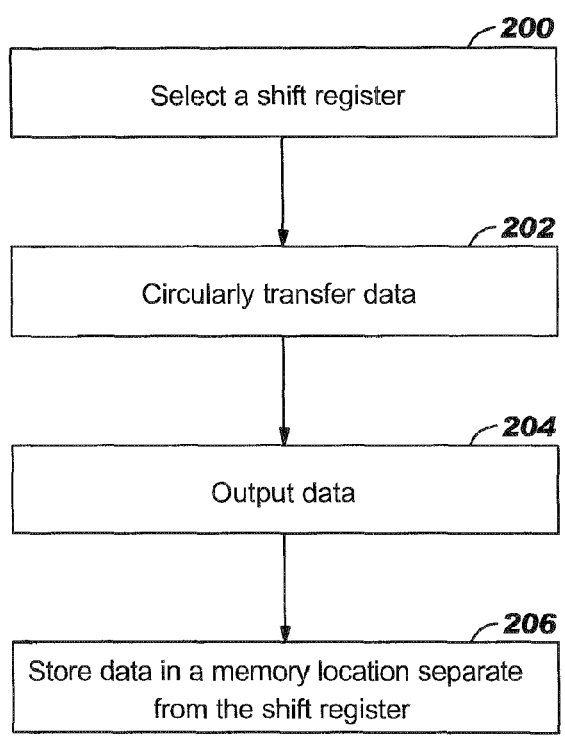
FIG. 2 is a flow diagram illustrating a preferred method of the invention.

As shown in flowchart form in FIG. 2, the invention uses the foregoing circuit to provide a method for observing data within a shift register without altering the data. The method selects a shift register 200 from many shift registers and then continually circularly transfers data 202 from the output 122 of the shift register to the input 121 of the shift register and back through the shift register in a circular manner. The method outputs data 204 as the data is transferred from the output 122 of the shift register to the input 121 of the shift register to permit data within the shift register to be observed outside the circuit without altering the data within the shift register. This allows the invention to send data to a location external to the shift register to allow the shift register to be examined by an external device.

The process of selecting the shift register 200 comprises controlling selectors 106, 107 to form a circuit between the output 122 of the shift register and the input 121 of the shift register by connecting a wiring loop 105 between the output 122 of the shift register and the input 121 of the shift register. This method can optionally store the data in a memory location separate from the shift register 206. As mentioned above, the invention provides the ability to alter the data between the time the data is received from the output 122 of the shift register and when the data is transferred to the input 121 of the shift register.

The circular data transfer 202 is performed for a single data transfer loop such that the data is at the same position within the shift register before and after the data transfer process. This method can determine the length of the shift register by sending a unique data marker (as discussed above) circularly through the shift register and counting the number of bits that pass through the shift register as the unique marker completes the circular loop through the shift register.

Figure 3:
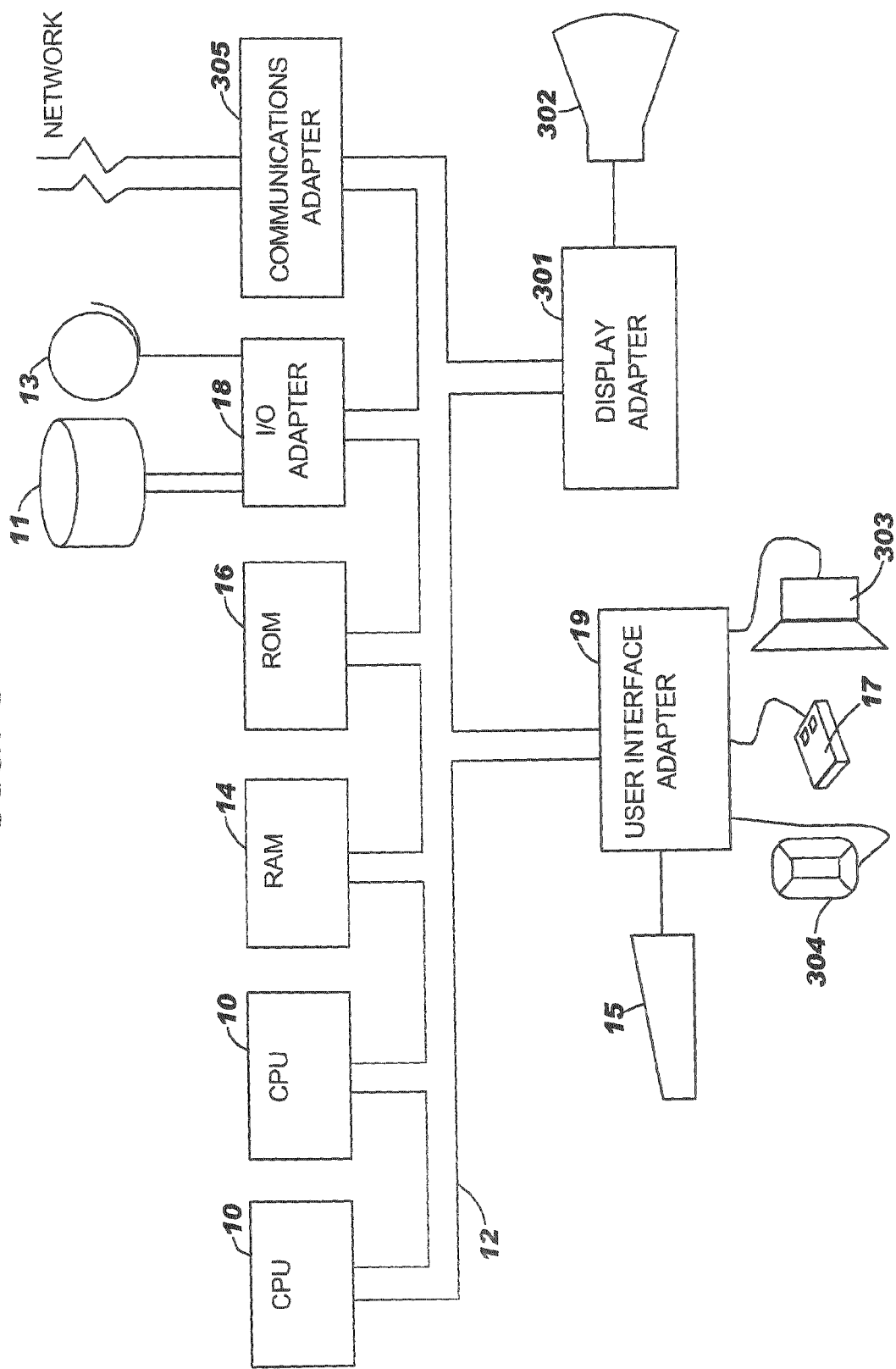
FIG. 3 is a hardware embodiment for use with the invention.

A representative hardware environment for practicing the present invention is depicted in FIG. 3, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 303, microphone 304, and/or other user interface devices such as touch screen device (not shown) to bus 12, communication adapter 305 for connecting the information handling system to a data processing network, and display adapter 301 for connecting bus 12 to display device 302. A program storage device readable by the disk or tape units is used to load the instructions which operate the invention also loaded onto the computer system.

The control logic 100, either as part of a normal operation, or as a specific operation code can be programmed to select one of the shift registers 112-114, and cause that shift register to shift in a rotating circular fashion via the two demultiplexors/multiplexors 106, 107. This allows the data in that shift register to be observed out of the observation input/output 103. Upon completion of the rotating shift operation, the initial value of the shift register is restored. Because this is a shift in a circular fashion, the control logic 100 only needs to shift the number of elements in the shift register in order to restore the data back to its original position.

The invention avoids using the standard LSSD scan clocks which destroy data in the rest of the latches on the chip, including latches within the circuit of interest, and restores data to the original position in latches.

While the invention has been described in terms of preferred embodiments, those skilled in the art will recognize that the invention can be practiced with modification within the spirit and scope of the appended claims.

What is claimed:

1. A circuit for observing and restoring data of a shift register without altering logical values of said data, said circuit comprising:
    a shift register comprising a single input receiving data, a plurality of latches connected in series and maintaining said data and a single output outputting said data;
    a wiring loop electrically connecting said output to said input;
    a control device operatively connected to said wiring loop between said output and said input, said control device causing said wiring loop to circulate any data, which is currently maintained in said latches of said shift register, from said output to said input and back into said latches of said shift register at least a single time such that said any data returns to a same position within said shift register;
    an observation wire connected to said wiring loop and said control device, said observation wire simultaneously passing said any data from said wiring loop to said control device as said any data is being circulated from said output to said input and back into said latches of said shift register,
    said control device further comprising an input/output port accessible from outside said circuit, said input/output port outputting said any data such that said any data is observable outside said circuit without altering any logical data values within said shift register.

2. The circuit in claim 1, said control device further comprising a storage device recording said any data as said any data appears on said wiring loop and is passed from said wiring loop to said control device.

3. The circuit in claim 1, said control device further comprising a write device changing one or more bits of said any data before said any data is circulated from said output to said input and back into said latches of said shift register.

4. The circuit in claim 1, said shift register comprising a serial-in/serial-out shift register.

5. A method for observing and restoring data of a shift register without altering logical values of said data, said method comprising:
    providing a circuit having a shift register with a single input receiving data, a plurality of latches connected in series and maintaining said data and a single output outputting said data, said output being electrically connected to said input so as to form a wiring loop;
    causing, by a control device, any data, which is currently maintained in said latches of said shift register, to circulate through said wiring loop from said output to said input and back into said latches of said shift register at least a single time such that said any data returns to a same position within said shift register;
    as said any data is being circulated, simultaneously allowing said any data to pass through an observation wire from said wiring loop to said control device, said control device being separate from said shift register; and
    outputting said any data, through an input/output port of said control device, such that said any data is observable outside said circuit without altering logical data values within said shift register.

6. The method in claim 5, further comprising storing said any data in a memory location separate from said shift register.

7. The method in claim 5, further comprising changing, by a write device, one or more bits of said any data before said any data is circulated from said output to said input and back into said latches of said shift register.

8. The method in claim 5, said outputting of said any data comprising directing said any data to a location external to said shift register so as to allow said shift register to be examined by an external device.

9. A method for observing and restoring data of a shift register without altering logical values of said data, said method comprising:
    providing a circuit having a plurality of shift registers, each shift register having a single input receiving data, a plurality of latches connected in series and maintaining said data and a single output outputting said data;

selectively connecting, by a control device, a selected output of a selected shift register to a selected input of said selected shift registers so as to form a wiring loop between said selected output and said selected input;

causing, by said control device, any data, which is currently maintained in said latches of said selected shift register, to circulate through said wiring loop from said selected output to said selected input and back into said latches of said selected shift register at least a single time such that said any data returns to a same position within said selected shift register;

as said data is being circulated, simultaneously allowing said any data to pass through an observation wire from said wiring loop to said control device, said control device being separate from said selected shift register; and outputting said any data, through an input/output port of said control device, such that said any data is observable outside said circuit without altering logical data values within said shift register.

10. The method in claim 9, further comprising storing said any data in a memory location separate from said shift register.

11. The method in claim 9, further comprising changing, by a write device, one or more bits of said any data before said any data is circulated from said output to said input and back into said latches of said shift register.

12. The method in claim 9, said outputting of said any data comprising directing said any data to a location external to said shift register so as to allow said shift register to be examined by an external device.

13. A program storage device readable by machine, tangibly embodying a program of instructions executable by the machine to perform a method of observing and restoring data of a shift register without altering logical values of said data, said shift register comprising a single input receiving data, a plurality of latches connected in series and maintaining said data and a single output outputting said data and said method comprising:

causing any data, which is currently maintained in said latches of said shift register, to circulate through a wiring loop from said output to said input and back into said latches of said shift register at least a single time such that said any data returns to a same position within said shift register;

as said data is being circulated, simultaneously allowing said any data to pass through an observation wire from said wiring loop to a device separate from said shift register; and outputting said any data, through an input/output port of said device, such said any data is observable outside said circuit without altering logical data values within said shift register.

14. The program storage device in claim 13, further comprising storing said any data in a memory location separate from said shift register.

15. The program storage device in claim 13, further comprising changing one or more bits of said any data before said any data is circulated from said output to said input and back into said latches of said shift register.

16. The method in claim 5, said shift register comprising a serial-in/serial-out shift register.

17. The method in claim 9, each shift register comprising a serial-in/serial-out shift register.

* * * * *